United States Patent
Fukasawa et al.

(10) Patent No.: US 8,619,825 B2
(45) Date of Patent: Dec. 31, 2013

(54) LIGHT-EMITTING DEVICE HAVING A THERMAL CONDUCTIVE MEMBER WITH WIRING FUNCTION AND METHOD OF MANUFACTURING THE SAME

(75) Inventors: Hiroyuki Fukasawa, Tokyo (JP); Hiroshi Nishida, Kanagawa (JP)

(73) Assignee: Sony Corporation, Tokyo (JP)

( * ) Notice: Subject to any disclaimer, the term of this patent is extended or adjusted under 35 U.S.C. 154(b) by 291 days.

(21) Appl. No.: 12/706,833

(22) Filed: Feb. 17, 2010

(65) Prior Publication Data

US 2010/0213471 A1 Aug. 26, 2010

(30) Foreign Application Priority Data

Feb. 24, 2009 (JP) .................... 2009-040768

(51) Int. Cl.
*H01S 3/04* (2006.01)
*H01S 3/042* (2006.01)

(52) U.S. Cl.
CPC .................... *H01S 3/0405* (2013.01)
USPC .............. 372/34; 257/E33.075; 372/36

(58) Field of Classification Search
USPC ............... 372/34, 36; 257/E33.075
See application file for complete search history.

(56) References Cited

U.S. PATENT DOCUMENTS

| | | | | |
|---|---|---|---|---|
| 4,442,450 A * | 4/1984 | Lipschutz et al. | ............. | 257/713 |
| 4,901,325 A | 2/1990 | Kato et al. | | |
| 5,402,436 A | 3/1995 | Paoli | | |
| 5,422,905 A * | 6/1995 | Andrews | ............. | 372/50.1 |
| 5,638,391 A | 6/1997 | Shima et al. | | |
| 5,664,586 A | 9/1997 | Sinclair et al. | | |
| 5,999,553 A | 12/1999 | Sun | | |
| 6,136,623 A | 10/2000 | Hofstetter et al. | | |
| 6,956,322 B2 | 10/2005 | Ikeda | | |
| 7,453,915 B2 * | 11/2008 | Imai | ............. | 372/50.1 |
| 2001/0033592 A1 * | 10/2001 | Yamauchi et al. | ............. | 372/50 |
| 2004/0028095 A1 * | 2/2004 | Ishida et al. | ............. | 372/36 |
| 2005/0074046 A1 * | 4/2005 | Kasai | ............. | 372/50 |
| 2005/0180472 A1 * | 8/2005 | Tzuk et al. | ............. | 372/34 |
| 2006/0131599 A1 * | 6/2006 | Slater et al. | ............. | 257/98 |
| 2007/0030872 A1 | 2/2007 | Sato et al. | | |

(Continued)

FOREIGN PATENT DOCUMENTS

| | | |
|---|---|---|
| JP | 63-237490 | 10/1988 |
| JP | 1992-085760 | 7/1992 |

(Continued)

OTHER PUBLICATIONS

Japanese Patent Office; JP Application No. 2009-040768; Office Action issued Jan. 25, 2011, 4 pages.

(Continued)

*Primary Examiner* — Fernando L Toledo
*Assistant Examiner* — Peter Bradford
(74) *Attorney, Agent, or Firm* — Dentons US LLP (57) ABSTRACT

A light-emitting device reliably supplying electric power to a light-emitting element on a supporting base and securing heat dissipation, and a method of manufacturing the light-emitting device are provided. A light-emitting device includes: a light-emitting element arranged on a first supporting base; a package covering the first supporting base and the light-emitting element therewith, and supporting the first supporting base; and a thermal conductive member having ends which are bonded to the light-emitting element and the package, respectively, so as to also have a wiring function.

11 Claims, 7 Drawing Sheets

(56) References Cited

U.S. PATENT DOCUMENTS

| | | | |
|---|---|---|---|
| 2007/0237196 A1* | 10/2007 | Oomori | 372/36 |
| 2008/0111142 A1 | 5/2008 | Furushima et al. | |
| 2009/0080485 A1* | 3/2009 | Yamasaki et al. | 372/50.1 |
| 2010/0177793 A1* | 7/2010 | Rossi et al. | 372/20 |
| 2011/0037091 A1* | 2/2011 | Fushimi | 257/98 |

FOREIGN PATENT DOCUMENTS

| | | |
|---|---|---|
| JP | 1994-334264 | 12/1994 |
| JP | 08-181394 | 7/1996 |
| JP | 11-186651 | 7/1999 |
| JP | 2001-230502 | 8/2001 |
| JP | 2007-048810 | 2/2007 |
| JP | 2007-194437 | 8/2007 |
| JP | 2007-234643 | 9/2007 |
| JP | 2008-124218 | 5/2008 |
| JP | 2008-151993 | 7/2008 |
| JP | 2000-228022 | 8/2008 |
| WO | WO 2007/065455 * | 6/2007 |

OTHER PUBLICATIONS

Japanese Office Action issued on Jan. 5, 2012 in connection with counterpart JP Application No. 2009-040768.

* cited by examiner

LIGHT-EMITTING DEVICE HAVING A THERMAL CONDUCTIVE MEMBER WITH WIRING FUNCTION AND METHOD OF MANUFACTURING THE SAME

BACKGROUND OF THE INVENTION

1. Field of the Invention

The present invention relates to a package-type light-emitting device including a light-emitting element contained in a package, and a method of manufacturing the light-emitting device.

2. Description of the Related Art

In recent year, in the field of semiconductor lasers, multiwavelength lasers including a plurality of light-emitting sections with different emission wavelengths on a common substrate (or a common base) have been actively developed. The multiwavelength laser is used as, for example, a light source for an optical disk device.

In such an optical disk device, 700-nm-band laser light is used to replay a CD (a Compact Disk), and to record and reproduce data to/from a recordable optical disk such as a CD-R (a CD Recordable), a CD-RW (a CD Rewritable) or an MD (a Mini Disk). Moreover, 600-nm-band laser light is used to record and reproduce data to/from a DVD (a Digital Versatile Disk). When the multiwavelength laser is mounted in the optical disk device, the optical disk device is allowed to record and reproduce data to/from a plurality of kinds of already available optical disks. Moreover, a short-wavelength (400-nm band) laser using a nitride-based Group III-V compound semiconductor (hereinafter referred to as "GaN-based compound semiconductor") typified by GaN, AlGaN and GaInN has been achieved, and the short-wavelength laser has been developed for practical use as a light source for a higher-density optical disk. When lasers including the short-wavelength laser have more wavelengths, the application of the lasers is expanded.

As a three-wavelength laser element (light-emitting device) including such a GaN-based laser oscillator, for example, a three-wavelength laser element manufactured by the following method has been proposed in related art. That is, first, a first light-emitting element with a 400-nM-band wavelength is formed by growing a GaN-based compound semiconductor on a GaN substrate. Moreover, a 600-nm-band element formed by growing an AlGaInP-based compound semiconductor and a 700-nm-band element formed by growing an AlGaAs-based compound semiconductor are arranged in parallel on the GaAs substrate to form a second light-emitting element. Then, the first light-emitting element and the second light-emitting element are laminated in this order on a supporting base. The three-wavelength laser element is formed in such a manner in related art. In the three-wavelength laser element in related art, heat generated in the second light-emitting element is dissipated from the GaN substrate or the supporting base both of which have good thermal conductivity, so high heat dissipation efficiency is obtained.

Japanese Unexamined Patent Application Publication No. 2007-234643 discloses a light-emitting device in which a first light-emitting element is arranged on a supporting base, and a second light-emitting element with a larger width than that of the first light-emitting element is bonded onto the first light-emitting element, and is supported on the supporting base by a plurality of bumps. In such a light-emitting device, heat generated in the second light-emitting element is conducted to the supporting base through the first light-emitting element or through the bumps.

SUMMARY OF THE INVENTION

In a light-emitting device described in Japanese Unexamined Patent Application Publication No. 2007-234643, when a second light-emitting element is mounted, it is necessary to bond the second light-emitting element to the first light-emitting element and bumps arranged on a supporting base. However, the height of the first light-emitting element are largely different from the heights of the bumps, so it is technically difficult to firmly bond the second light-emitting element to both of the first light-emitting element and the bumps.

Moreover, to mount the light-emitting elements on the supporting base, there is a method of bonding the first light-emitting element and the second light-emitting element together, and then mounting the light-emitting elements onto the supporting base. However, also in the method, as in the above-described case, the height of the first light-emitting element is largely different from the heights of the bumps, so it is technically difficult to firmly bond the second light-emitting element to both of the first light-emitting element and the bumps.

In the case where the second light-emitting element is not firmly bonded to the first light-emitting element or the bumps, there is an issue that it is difficult to supply electric power to the second light-emitting element. Moreover, even if the second light-emitting element is bonded to the first light-emitting element and the bumps, thereby to allow electric power to be supplied to the second light-emitting element, there is an issue that heat generated in the second light-emitting element is not sufficiently conducted to the supporting base.

It is desirable to provide a light-emitting device reliably supplying electric power to a light-emitting element on a supporting base and securing heat dissipation, and a method of manufacturing the light-emitting device.

According to an embodiment of the invention, there is provided a light-emitting device including: a light-emitting element arranged on a first supporting base; a package covering the first supporting base and the light-emitting element therewith, and supporting the first supporting base; and a thermal conductive member having ends which are bonded to the light-emitting element and the package, respectively, so as to also have a wiring function.

In the light-emitting device according to the embodiment of the invention, the thermal conductive member is bonded to the light-emitting element and the package. Thereby, for example, even if a heat generation region in the light-emitting element is apart from the first supporting base, or even if a region with poor thermal conductivity is present between the heat generation region in the light-emitting element and the first supporting base, heat generated in the light-emitting element is allowed to be conducted to the thermal conductive member. Moreover, for example, even if heat generated in the light-emitting element is extremely high, a large amount of heat generated in the light-emitting element is allowed to be conducted to not only the first supporting base but also the thermal conductive member. Further, in the embodiment of the invention, the thermal conductive member also has a wiring function, so electric power is supplied to the light-emitting element through the thermal conductive member or the like.

According to an embodiment of the invention, there is provided a method of manufacturing a light-emitting device including the following steps (A) and (B):

(A) a first step of preparing a module including a first supporting base, a second supporting base and a light-emitting element, the second supporting base supporting the first supporting base, the light-emitting element being arranged on a side surface of the first supporting base in relation to the second supporting base; and (B) a second step of arranging a thermal conductive member also having a wiring function astride the light-emitting element and the second supporting base in a state in which the module is inclined so as to move a corner section formed by the first supporting base and the second supporting base downward, and fixing the thermal conductive member to the light-emitting element and the second supporting base in a state in which a thermal conductive member is arranged between the light-emitting element and the thermal conductive member and between the second supporting base and the thermal conductive member.

In the method of manufacturing a light-emitting device according to the embodiment of the invention, at the time of bonding the thermal conductive member, the whole module is inclined. Therefore, a force on the thermal conductive member tending to be bonded to the light-emitting element and the second supporting base is generated, so the thermal conductive member is reliably bonded to the light-emitting element and the second supporting base. Thereby, for example, even if a heat generation region in the light-emitting element is apart from the first supporting base, or even if a region with poor thermal conductivity is present between the heat generation region in the light-emitting element and the first supporting base, heat generated in the light-emitting element is allowed to be conducted to the thermal conductive member. Moreover, for example, even if heat generated in the light-emitting element is extremely high, a large amount of heat generated in the light-emitting element is allowed to be conducted to not only the first supporting base but also the thermal conductive member. Further, in the embodiment of the invention, the thermal conductive member also has a wiring function, so electric power is supplied to the light-emitting element through the thermal conductive member or the like.

In the light-emitting device according to the embodiment of the invention, the thermal conductive member also having a wiring function is bonded to the light-emitting element and the package, so electric power is reliably supplied to the light-emitting element on a supporting base (the first supporting base), and heat dissipation is secured.

In the method of manufacturing a light-emitting device according to the embodiment of the invention, the whole module is inclined at the time of bonding the thermal conductive member, so electric power is reliably supplied to the light-emitting element on a supporting base (the first supporting base), and heat dissipation is secured.

Other and further objects, features and advantages of the invention will appear more fully from the following description.

DETAILED DESCRIPTION OF THE PREFERRED EMBODIMENTS

Figure 1:
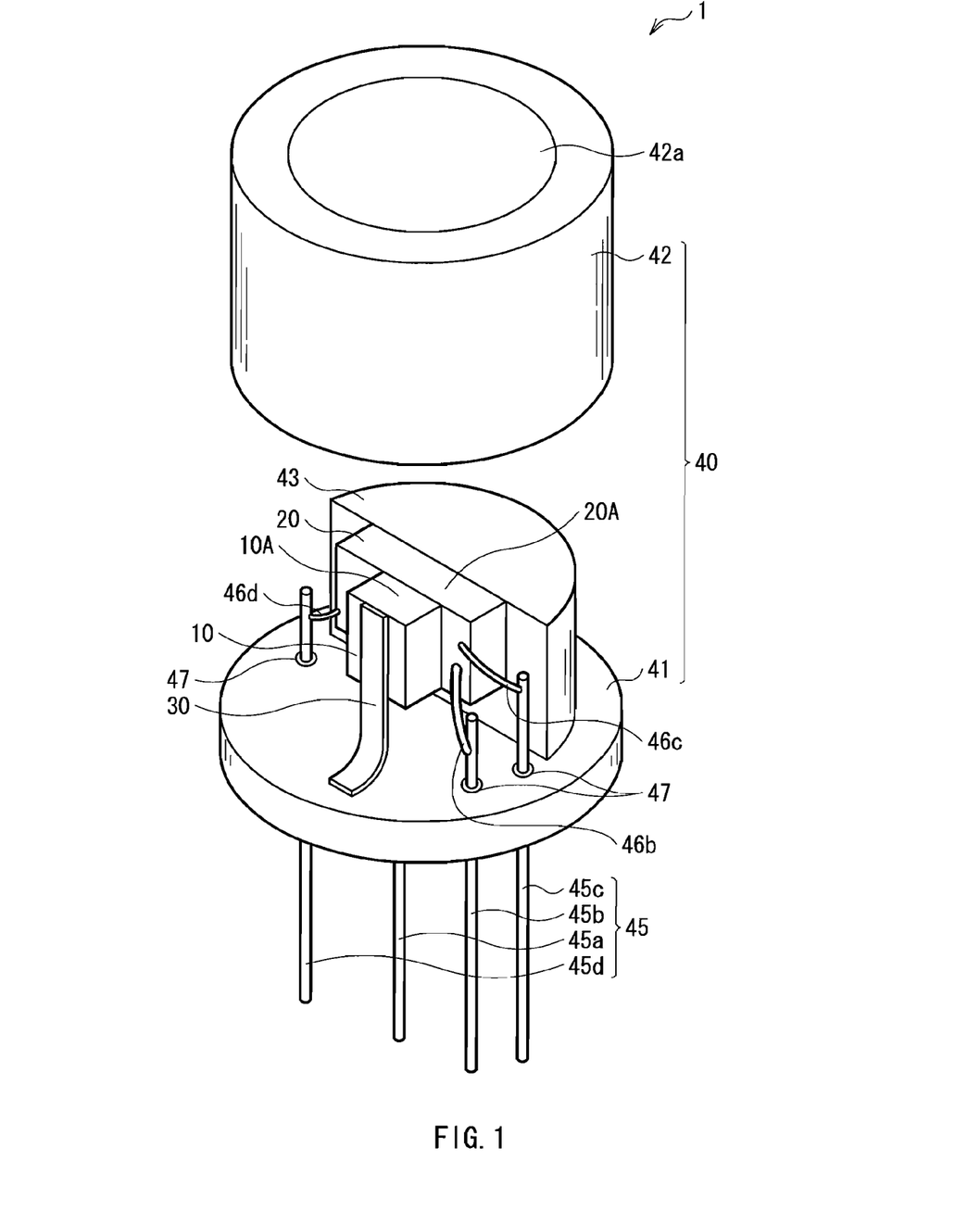
FIG. 1 is an exploded perspective view of a light-emitting device according to a first embodiment of the invention.

Preferred embodiments will be described in detail below referring to the accompanying drawings. Descriptions will be given in the following order.
1. First Embodiment (including two light-emitting elements, and using a ribbon for a thermal conductive member)
2. Second Embodiment (including two light-emitting elements, and using a lead frame for the thermal conductive member)
3. Third Embodiment (including one light-emitting element, and using a ribbon or a lead frame for the thermal conductive member)
4. Modifications First Embodiment Configuration of Light-Emitting Device FIG. 1 illustrates an exploded perspective view of a light-emitting device 1 according to a first embodiment of the invention. The light-emitting device 1 according to the first embodiment is suitably used as a light source for an optical disk device recording and reproducing data to/from an optical disk. As illustrated in FIG. 1, the light-emitting device 1 is, for example, a multiwavelength laser in which a first light-emitting element 10 and a second light-emitting element 20 are contained in a package 40. The first light-emitting element 10 and the second light-emitting element 20 are edge-emission semiconductor lasers, and are arranged on a die pad 43 (a first supporting base) which will be described later so that light-emission surfaces 10A and 20A thereof are oriented in a direction toward an extraction window 42a which will be described later.

The first light-emitting element 10 is formed on a top surface of the second light-emitting element 20. In other words, the first light-emitting element 10 and the second light-emitting element 20 are laminated in a state in which the second light-emitting element 20 is arranged on the die pad 43. The second light-emitting element 20 is an element having a larger chip size than that of the first light-emitting element 10, and, for example, the width of the second light-emitting element 20 is larger than the width of the first light-emitting element 10.

Figure 2A:
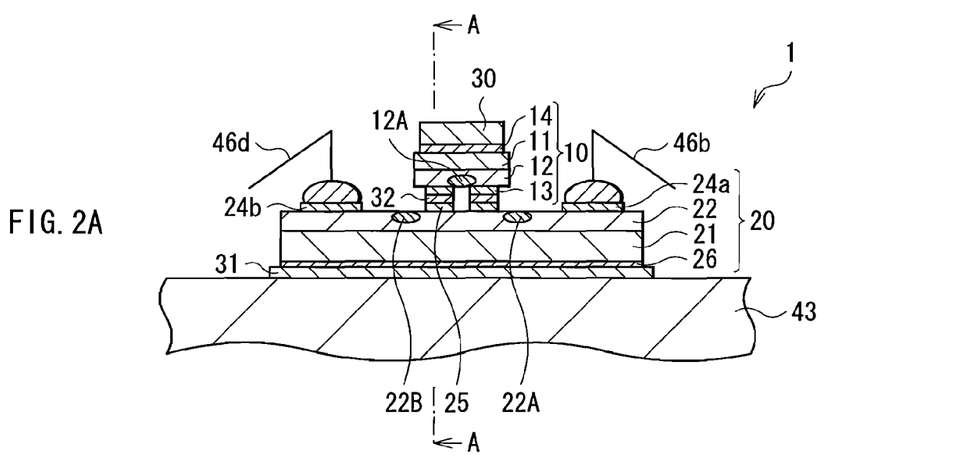
FIGS. 2A and 2B are sectional views of the light-emitting device illustrated in FIG. 1.
Figure 2B:
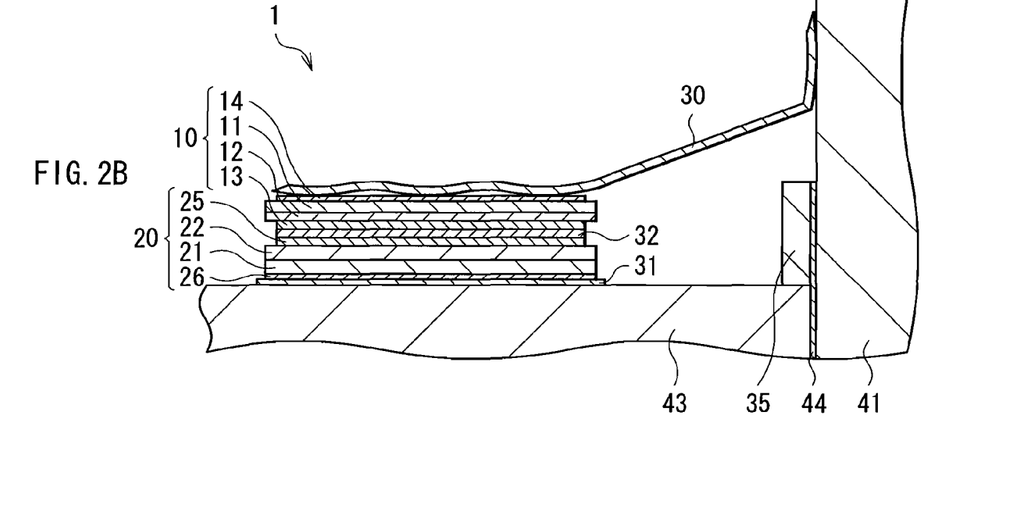

FIG. 2A illustrates a sectional configuration example of a part including the first light-emitting element 10 and the second light-emitting element 20 of the light-emitting device 1 taken along a plane parallel to the light-emission surfaces 10A and 20A. FIG. 2B illustrates a sectional configuration example of the part including the first light-emitting element 10 and the second light-emitting element 20 of the light-emitting device 1 taken along a plane orthogonal to the light-emission surfaces 10A and 20A, that is, a sectional configuration example taken along a line A-A in FIG. 2A.

The first light-emitting element 10 includes a laser configuration 12 forming a light-emitting point 12A on a substrate 11, and is, for example, a single-wavelength semiconductor laser emitting 400-nm-band laser light. The substrate 11 is, for example, a GaN substrate. The laser configuration 12 is formed on a side closer to the second light-emitting element 20 in relation to the substrate 11, and is made of, for example, a GaN-based compound semiconductor. The GaN substrate has a high thermal conductivity of approximately 130 W/(m·K), so in the GaN substrate, heat generated in the first light-emitting element 10 to be easily conducted.

In the first light-emitting element 10, a p-side electrode 13 is formed on a surface closer to the second light-emitting element 20 of the laser configuration 12. The p-side electrode 13 is electrically connected to the surface closer to the second light-emitting element 20 of the laser configuration 12. Moreover, an n-side electrode 14 is formed on a surface farther from the second light-emitting element 20 of the substrate 11. The n-side electrode 14 is electrically connected to the surface farther from the second light-emitting element 20 of the substrate 11.

The second light-emitting element 20 includes a laser configuration (not illustrated) forming a light-emitting point 22A and a laser configuration (not illustrated) forming a light-emitting point 22B on a common substrate 21. In FIGS. 2A and 2B, these laser configurations are integrally illustrated as a single laser configuration 22. The laser configuration forming the light-emitting point 22A emits, for example, 600-nm-band laser light, and the laser configuration forming the light-emitting point 22B emits, for example, 700-nm-band laser light. In other words, the second light-emitting element 20 is, for example, a two-wavelength semiconductor laser emitting 600-nm-band laser light and 700-nm-band laser light.

The substrate 21 is, for example, a GaAs substrate. The laser configuration forming the light-emitting point 22A is made of, for example, an AlGaInP-based compound semiconductor. The laser configuration forming the light-emitting point 22B is made of, for example, a GaAs-based compound semiconductor. The GaAs substrate has a low thermal conductivity of approximately 17.8 W/((m·K), so in the GaAs substrate, it is difficult to conduct heat generated in the second light-emitting element 20.

In the second light-emitting element 20, a p-side electrode 24a is formed on a top surface of the laser configuration forming the light-emitting point 22A. The p-side electrode 24a is electrically connected to the top surface of the laser configuration forming the light-emitting point 22A. Moreover, a p-side electrode 24b is formed on a top surface of the laser configuration forming the light-emitting point 22B. The p-side electrode 24b is electrically connected to the top surface of the laser configuration forming the light-emitting point 22B. Further, a wiring pattern 25 electrically connected to the p-side electrode 13 of the first light-emitting element 10 is formed on a top surface of the laser configuration 22 so as to be insulated and separated from the laser configuration 22. An n-side electrode 26 is formed on a bottom surface of the substrate 21. The n-side electrode 26 is electrically connected to both of a bottom surface of the laser configuration forming the light-emitting point 22A and a bottom surface of the laser configuration forming the light-emitting point 22B through the substrate 21.

The second light-emitting element 20 is bonded to the die pad 43 with a conductive bonding material 31 (a second conductive bonding material) such as a metal alloy or an electrically-conductive adhesive. Thereby, the n-side electrode 26 is electrically connected to the die pad 43 through the conductive bonding material 31. On the other hand, the first light-emitting element 10 is bonded to a top surface of the second light-emitting element 20 with a conductive bonding material 32 (a third conductive bonding material) such as a metal alloy or an electrically-conductive adhesive in a state the first light-emitting element 10 is placed the laser configuration 12-side down. Thereby, the p-side electrode 13 is electrically connected to the wiring pattern 25 through the conductive bonding material 32.

As described above, in the embodiment, the second light-emitting element 20 with low thermal conductivity is arranged between the first light-emitting element 10 and the die pad 43. Therefore, it is difficult to conduct heat generated in the first light-emitting element 10 to the die pad 43 through the second light-emitting element 20. In the embodiment, to dissipate the heat generated in the first light-emitting element 10, a thermal conductive member 30 is bonded to a top surface (a surface farther from the second light-emitting element 20) of the first light-emitting element 10.

The thermal conductive member 30 is configured of a sheet-shaped member (a ribbon) formed by flatly spreading, for example, a material mainly containing aluminum (for example, an aluminum alloy). The thermal conductive member 30 preferably has a larger thickness in a part allowed to be bonded to the first light-emitting element 10, because when the thickness of the thermal conductive member 30 is increased, the sectional area and the surface area of the thermal conductive member 30 are increased, thereby to improve thermal conductivity and heat dissipation of the thermal conductive member 30. Moreover, the thermal conductive member 30 preferably has a smaller length in the part allowed to be bonded to the first light-emitting element 10, because when the length of the thermal conductive member 30 is reduced, the thermal conductivity of the thermal conductive member 30 is improved. As the thermal conductive member 30, for example, a sheet-shaped member with a thickness of approximately 70 μm is used.

Moreover, as the thermal conductive member 30, for example, a sheet-shaped member formed by flatly spreading a material mainly containing gold (for example, a gold alloy) may be used. In the case where a sheet-shaped member made of a gold alloy is used as the thermal conductive member 30, the thermal conductive member 30 is allowed to be more firmly bonded to the n-side electrode 14 and a heat sink 41 which will be described later.

In addition, as the thermal conductive member 30, a wire may be used. However, in the case where a wire with a diameter of 25 μm made of 99.99% gold is used, the wire is thin, so the wire has little effect of contributing to heat conductivity, so there is a disadvantage that it is necessary to arrange a plurality of wires. Moreover, when a large amount of current flows through the wires, the wires may generate heat or may be fused, so it is necessary to consider an acceptable amount of current. For example, in the case where a wire with a diameter of 25 μm is made of 99.99% gold, when a current of 400 mA or over flows through the wire, the wire generates heat, and when a current of 600 mA to 1 A flows through the wire, the wire is fused.

The thermal conductive member 30 is bonded to the n-side electrode 14 of the first light-emitting element 10, and is bonded to the heat sink 41 which will be described later. Therefore, the thermal conductive member 30 has a heat conducting function from the first light-emitting element 10 to the heat sink 41. Moreover, as will be described later, a connection terminal 45a is electrically connected to the heat sink 41. Therefore, the thermal conductive member 30 also has a function of sending electricity between the n-side electrode 14 and the connection terminal 45a. Thereby, the thermal conductive member 30 has three functions, that is, a heat conducting function, a heat dissipating function and a wiring function.

In addition, in the light-emitting device 1, as illustrated in FIG. 2B, a light-receiving element 35 may be arranged. The light-receiving element 35 receives light (monitoring light) leaked from rear ends of the first light-emitting element 10 and the second light-emitting element 20, and outputs an electrical signal (a photocurrent) corresponding to the output level of the received light. When the electrical signal is used, the intensity of light outputted from the extraction window 42a of the light-emitting device 1 is allowed to be inferred from analogy. In this case, to prevent the thermal conductive member 30 from blocking monitoring light, it is necessary to arrange the thermal conductive member 30 in a position other than an optical path of monitoring light traveling from the first light-emitting element 10 and the second light-emitting element 20 to the light-receiving element 35. Therefore, an end on a side closer to the heat sink 41 of the thermal conductive member 30 is preferably bonded to a position which is sufficiently apart from the light-receiving element 35.

As illustrated in FIG. 1, the package 40 is a package accommodating the first light-emitting element 10, the second light-emitting element 20 and the die pad 43. The package 40 includes, for example, the disk-shaped heat sink 41 (a second supporting base) and a lid 42 bonded to the heat sink 41. As illustrated in FIG. 2B, a conductive bonding material 44 (a first conductive bonding material) such as a metal alloy or an electrically conductive adhesive is formed on the heat sink 41, and the die pad 43 (the first supporting base) is bonded to the heat sink 41 with the conductive bonding material 44 in between.

The first light-emitting element 10 and the second light-emitting element 20 are arranged on a side surface of the die pad 43 in relation to the heat sink 41. In other words, the n-side electrode 14 is also arranged on the side surface of the die pad 43 in relation to the heat sink 41, and a normal (not illustrated) of the n-side electrode 14 and a normal of a surface (the heat sink 41) bonded to the thermal conductive member 30 of the package 40 cross each other (are orthogonal to each other).

In the case where the above-described light-receiving element 35 is arranged, the light-receiving element 35 is also bonded to the heat sink 41 with the conductive bonding material 44 in between. In other words, the heat sink 41 has a function as a supporting base which supports the first light-emitting element 10, the second light-emitting element 20, the die pad 43, the light-receiving element 35 or the like, and forms a bottom section of the package 40. The heat sink 41, the lid 42 and the die pad 43 each are made of, for example, metal or conductive ceramic. As the metal used for the heat sink 41, the lid 42 and the die pad 43, metal having high heat dissipation, for example, a gold-plated material mainly containing copper or iron, or a Cu block is preferably used. In addition, as the metal used for them, a material mainly containing aluminum (for example, an aluminum alloy), a material mainly containing gold (for example, a gold alloy) or the like is preferably used.

Moreover, as illustrated in FIG. 1, a plurality of insulating rings 47 are arranged in the heat sink 41 so as to penetrate through the heat sink 41, and through holes are present in the insulating rings 47. A plurality of connection terminals 45 (45b to 45d) are arranged so as to pass through the insulating rings 47, respectively. The connection terminals 45b to 45d are insulated and separated from the heat sink 41 by the insulating rings 47. The connection terminal 45b is electrically connected to, for example, the p-side electrode 24a through a wire 46b. The connection terminal 45c is electrically connected to, for example, the wiring pattern 25 through a wire 46c. The connection terminal 45d is electrically connected to, for example, the p-side electrode 24b through a wire 46d. Moreover, a connection terminal 45 (45a) directly connected to the heat sink 41 not through the insulating rings 47 is arranged. The connection terminal 45a is electrically connected to the die pad 43 and the heat sink 41.

For example, as illustrated in FIG. 1, the lid 42 has a cylindrical shape. An opening (an opening on a side closer to the heat sink 41) of the lid 42 is provided so that the first light-emitting element 10 and the second light-emitting element 20 are inserted into the opening at the time of assembling. The other opening (an opening on a side farther from the heat sink 41) of the lid 42 is provided so as to extract light emitted from the first light-emitting element 10 and the second light-emitting element 20 therefrom, and the extraction window 42a sealed with a transparent member is arranged in the opening.

Manufacturing Method

The light-emitting device 1 with such a configuration is manufactured by, for example, the following steps. First, the second light-emitting element 20 is bonded to the die pad 43 with the conductive bonding material 31 in between so that the substrate 21 of the second light-emitting element 20 faces the die pad 43. Next, the first light-emitting element 10 is bonded to the second light-emitting element 20 with the conductive bonding material 32 in between so that a side opposite to the substrate 11 of the first light-emitting element 10 faces the second light-emitting element 20. At this time, in the case where metal alloys are used as the conductive bonding materials 31 and 32 for bonding the second light-emitting element 20 and bonding the first light-emitting element 10, as a metal alloy used for bonding the second light-emitting element 20, a metal alloy having a higher melting point than that of a metal alloy used for bonding the first light-emitting element 10 is used. Thereby, at the time of bonding the first light-emitting element 10, the metal alloy used for bonding the second light-emitting element 20 is prevented from being melted to displace the second light-emitting element 20. Moreover, the first light-emitting element 10 and the second light-emitting element 20 are bonded so that the substrate 11 of the first light-emitting element 10 and the substrate 21 of the second light-emitting element 20 are separated from each other, so the light-emitting points 12A, 22A and 22B are closely arranged. Thereby, laser light emitted from the light-emitting point 12A, laser light emitted from the light-emitting point 22A and laser light emitted from the light-emitting point 22B pass through optical paths which are adjacent to one another, respectively, thereby a common lens system is applicable.

In addition, in the case where the first light-emitting element 10 and the second light-emitting element 20 are arranged on the die pad 43, first, the first light-emitting element 10 and the second light-emitting element 20 may be bonded together, and then the second light-emitting element 20 and the die pad 43 may be bonded together. At this time, in the case where metal alloys are used as the conducive bonding materials 31 and 32 for each bonding, as a metal alloy used for bonding the first light-emitting element 10 and the second light-emitting element 20 together, a metal alloy having a higher melting point than that of a metal alloy used for bonding the second light-emitting element 20 and the heat sink 41 together is used. Thereby, at the time of bonding the second light-emitting element 20 and the heat sink 41 together, the metal alloy used for bonding the first light-emitting element 10 and the second light-emitting element 20 together is prevented from being melted to displace the first light-emitting element 10.

Next, the thermal conductive member 30 is bonded so as to be laid astride a top surface (the n-side electrode 14) of the first light-emitting element 10 and a top surface (a surface on a side closer to the first light-emitting element 10) of the heat sink 41. An ultrasonic wedge bonding method may be used for bonding the thermal conductive member 30. After that, the wires 46b to 46d are bonded between the p-side electrodes 24a and 24b and the wiring pattern 25 of the second light-emitting element 20 and the connection terminals 45 (45b to 45d), respectively, so as to bring conduction therebetween. Next, the lid 42 is bonded to the top surface of the heat sink 41, and the first light-emitting element 10 and the second light-emitting element 20 are contained in the package 40.

When electrical connection is established between horizontal planes in the case where a high electrical capacitance is necessary, the above-described ultrasonic wedge bonding method has heretofore been used. However, in the embodiment, the ultrasonic wedge bonding method differs from an ultrasonic wedge bonding method in related art in that the method is used for heat dissipation, and that the first light-emitting element 10 and the heat sink 41 have planes substantially orthogonal to each other.

The case where ultrasonic wedge bonding is performed on the planes substantially orthogonal to each other will be described below. First, the thermal conductive member 30 is placed on the top surface (the n-side electrode 14) of the first light-emitting element 10, and the thermal conductive member 30 is pressed by a metal stick called a tool with a V-shaped end, and an ultrasonic wave is applied so as to bond an edge (one end) of the thermal conductive member 30 to the first light-emitting element 10. In this case, the length (a length in a direction toward an resonator) of the first light-emitting element 10 is short, only one bonding point may be necessary, but in the case where the length is long, to efficiently dissipate heat generated in the first light-emitting element 10, a plurality of bonding points are preferably arranged as illustrated in FIG. 2B. After that, the tool is moved upward so as to move the thermal conductive member 30 by a desired length and to rotate the heat sink 41 by 90°. Next, the thermal conductive member 30 is placed on the top surface of the heat sink 41, and the thermal conductive member 30 is pressed by the tool, and an ultrasonic wave is applied to complete second bonding. In addition, at the time of the second bonding, when the thermal conductive member 30 is strongly pressed, the thermal conductive member 30 is automatically cut.

Functions and Effects

In the light-emitting device 1 manufactured in such a manner, when a voltage from a power source is applied between the n-side electrode 14 and the p-side electrode 13 of the first light-emitting element 10 through the thermal conductive member 30 and the wire 46c, 400-nm-band laser light is emitted from the light-emitting point 12A of the first light-emitting element 10. Likewise, when a voltage from the power source is applied between the n-side electrode 26 and the p-side electrode 24a of the second light-emitting element 20 through the die pad 43 and the wire 46b, 600-nm-band laser light is emitted from the light-emitting point 22A of the second light-emitting element 20. Moreover, when a voltage from the power source is applied between the n-side electrode 26 and the p-side electrode 24b of the second light-emitting element 20 through the die pad 43 and the wire 46d, 700-nm-band laser light is emitted from the light-emitting point 22B of the second light-emitting element 20. In other words, laser light of one band selected from bands of 400 nm, 600 nm and 700 nm is emitted from the light-emitting device 1.

At this time, Joule heat by a high current density is generated in the light-emitting elements 10 and 20 emitting laser light. Heat generated in the first light-emitting element 10 is conducted to the heat sink 41 through the second light-emitting element 20 and the die pad 43, and through the thermal conductive member 30. As a result, heat is dissipated from the heat sink 41, the die pad 43 and the thermal conductive member 30. Moreover, heat generated in the second light-emitting element 20 is conducted to the heat sink 41 through the die pad 43, and through the first light-emitting element 10 and the thermal conductive member 30. As a result, heat is dissipated from the heat sink 41, the die pad 43 and the thermal conductive member 30.

In the embodiment, the thermal conductive member 30 is bonded to the top surface of the first light-emitting element 10 and the top surface of the heat sink 41. Thereby, even if the second light-emitting element 20 with poor thermal conductivity is arranged between the first light-emitting element 10 and the die pad 43, heat generated in the first light-emitting element 10 is conducted to the heat sink 41 through the thermal conductive member 30 so as to be dissipated from the heat sink 41 and the thermal conductive member 30. Moreover, the thermal conductive member 30 is electrically connected to the n-side electrode 14 and the connection terminal 45a so as to also have a wiring function. Thereby, even if the first light-emitting element 10 is arranged on the die pad 43 with the second light-emitting element 20 in between, electric power is allowed to be easily and reliably supplied to the first light-emitting element 10 through the thermal conductive member 30 and the wire 46c.

Moreover, in the embodiment, the second light-emitting element 20 with a larger chip size (a larger width) than that of the first light-emitting element 10 is arranged between the first light-emitting element 10 and the die pad 43. Thereby, bonding between the die pad 43 and the second light-emitting element 20 and bonding between the second light-emitting element 20 and the first light-emitting element 10 are allowed to be easily and reliably performed.

Further, the GaN-based compound semiconductor of which the first light-emitting element 10 is made is more expensive than the AlGaInP-based compound semiconductor and the GaAs-based compound semiconductor of which the second light-emitting element 20 is made. In the embodiment, the chip size of the first light-emitting element 10 is smaller than that of the second light-emitting element 20, so compared to the case where the first light-emitting element 10 is formed so as to have a larger size than that of the second light-emitting element 20, the light-emitting device 1 is manufacturable at lower cost.

Other embodiments of the invention will be described below. In the following embodiments, like components are denoted by like numerals as of the first embodiment and will not be further described.

Second Embodiment

Figure 3A:
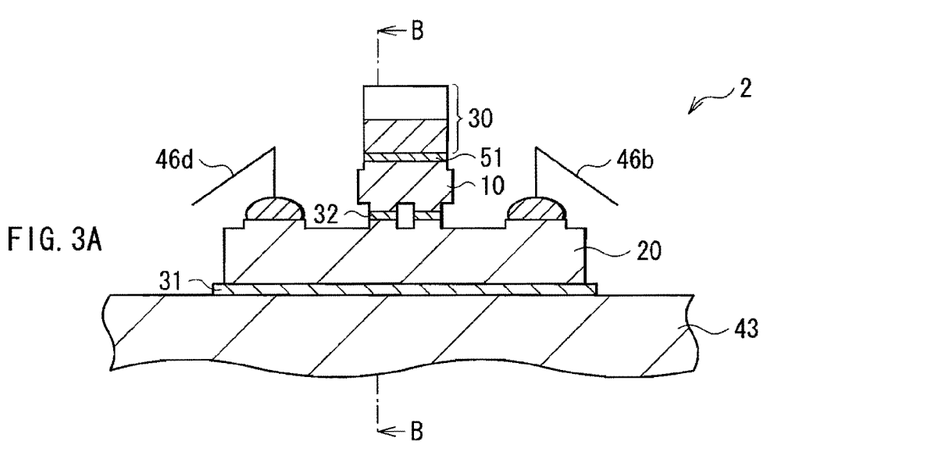
FIGS. 3A and 3B are sectional views of a light-emitting device according to a second embodiment of the invention.
Figure 3B:
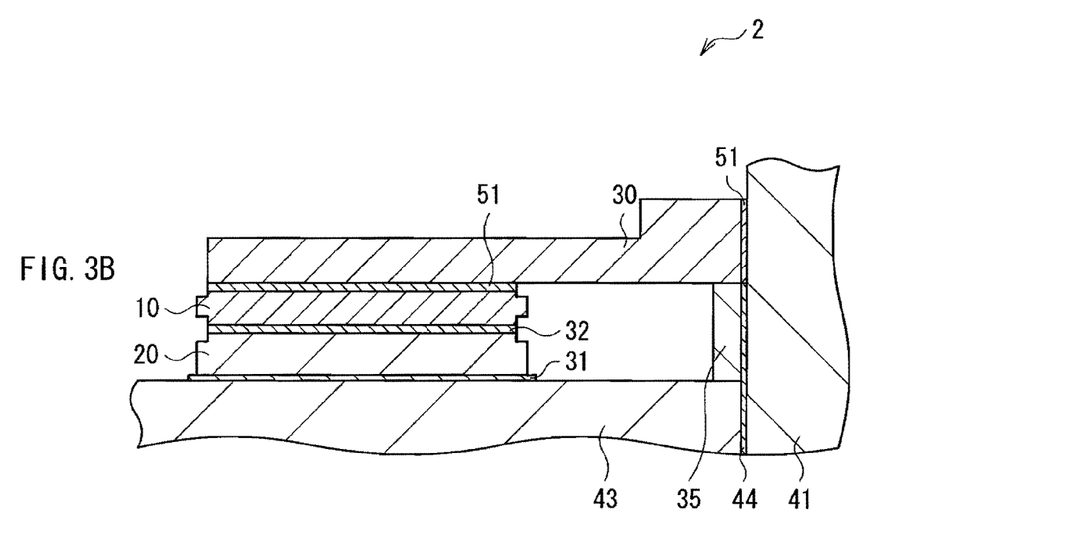

FIGS. 3A and 3B illustrate sectional views of a light-emitting device 2 according to a second embodiment of the invention. More specifically, FIG. 3A illustrates a sectional configuration example of a part including the first light-emitting element 10 and the second light-emitting element 20 in the light-emitting device 2 taken along a plane parallel to the light-emitting surfaces 10A and 20A. FIG. 3B illustrates a sectional configuration example of the part including the first light-emitting element 10 and the second light-emitting element 20 of the light-emitting device 2 taken along a plane orthogonal to the light-emitting surfaces 10A and 20A, that is, a sectional configuration example taken along a line B-B in FIG. 3A. In addition, in FIGS. 3A and 3B, components of the first light-emitting element 10 and the second light-emitting element 20 are not illustrated.

The light-emitting device 2 differs from the light-emitting device 1 in that as the thermal conductive member 30, a plate-shaped member is used instead of the sheet-shaped member (a ribbon). The thermal conductive member 30 is configured of, for example, a lead frame formed by plating a plate made of copper or the like with gold, and the thermal conductive member 30 is formed so that an end bonded to the heat sink 41 is folded. In the thermal conductive member 30, a conductive bonding material 51 such as a metal alloy or an electrically conductive adhesive is arranged at a point bonding to the first light-emitting element 10 and a point bonding to the heat sink 41.

Figure 4:
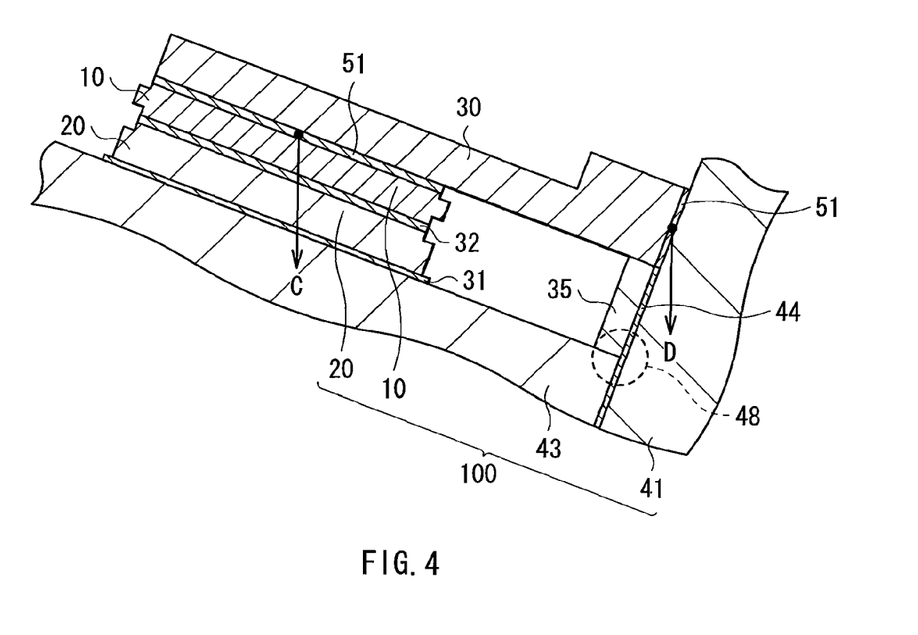
FIG. 4 is a sectional view of a light-emitting device when a thermal conductive member is bonded to a first light-emitting element and a heat sink.

For example, the thermal conductive member 30 is bonded to the first light-emitting element 10 and the heat sink 41 in the following manner. First, the die pad 43, the heat sink 41 supporting the die pad 43 and a module 100 including the first light-emitting element 10 and the second light-emitting element 20 arranged on a side surface of the die pad 43 in relation to the heat sink 41 are prepared (refer to FIG. 4). At this time, if necessary, the light-receiving element 35 is also arranged on the heat sink 41. Next, the thermal conductive member 30 is arranged astride the top surface (the n-side electrode 14) of the first light-emitting element 10 and the top surface (a surface on a side closer to the first light-emitting element 10) of the heat sink 41. At this time, the conductive bonding material 51 is arranged between the top surface of the first light-emitting element 10 and the thermal conductive member 30 and between the top surface of the heat sink 41 and the thermal conductive member 30. Next, the conductive bonding material 51 is heated to be melted, thereby the top surface of the first light-emitting element 10 and the thermal conductive member 30 are bonded together, and the top surface of the heat sink 41 and the thermal conductive member 30 are bonded together. Next, at the time of cooling down after fusion connection, for example, as illustrated in FIG. 4, the whole module 100 is inclined (for example, at approximately 20°) so as to move a corner section 48 formed by the heat sink 41 and the die pad 43 downward. Thereby, a force on the thermal conductive member 30 tending to touch the top surface of the first light-emitting element 10 and the top surface of the heat sink 41, that is, surface tension is generated in a bonding section between the top surface of the first light-emitting element 10 and the thermal conductive member 30 and a bonding section between the top surface of the heat sink 41 and the thermal conductive member 30 (refer to arrows C and D in the drawing). After that, when the conductive bonding material 51 is set, the thermal conductive member 30 is firmly fixed on the top surface of the first light-emitting element 10 and the top surface of the heat sink 41.

In addition, the whole module 100 may be inclined when the conductive bonding material 51 is heated to be melted, or when the thermal conductive member 30 is arranged. In both cases, it is necessary for the whole module 100 to be inclined at the time of cooling down after fusion connection.

In the case where the metal alloys are used as the conductive bonding materials 31, 32 and 51, as a metal alloy used for the conductive bonding material 51, a metal alloy with a lower melting point than the melting points of metal alloys used for the conductive bonding materials 31 and 32 is used. Thereby, when the thermal conductive member 30 is bonded, the metal alloys used for bonding the first light-emitting element 10 and the second light-emitting element 20 are prevented from being melted to displace each of the light-emitting elements 10 and 20.

The thermal conductive member 30 in the embodiment is formed so as to have a larger thickness than that of the thermal conductive member 30 with a sheet shape. Thereby, the sectional area of the thermal conductive member 30 is increased, so high thermal conductivity is allowed to be secured. Moreover, the surface area of the thermal conductive member 30 is also increased, so high heat dissipation is allowed to be secured. Therefore, even if heat generated in the first light-emitting element 10 is extremely high, the heat is conducted to the heat sink 41 through the thermal conductive member 30, and the heat is allowed to be dissipated from the heat sink 41 and the thermal conductive member 30.

Moreover, in the embodiment, in an assembling step, the whole module 100 is inclined at the time of bonding the thermal conductive member 30 so as to generate a force (surface tension) on the module 100 tending to be bonded to the thermal conductive member 30. Thereby, bonding between the thermal conductive member 30 and the first light-emitting element 10 and bonding between the thermal conductive member 30 and the heat sink 41 are improved. Moreover, the thermal conductive member 30 is arranged at a predetermined position, so a failure that thermal conductive member 30 is obliquely bonded to the first light-emitting element 10 and the die pad 43 to cause a reduction in bonding areas therebetween is preventable.

Figure 5:
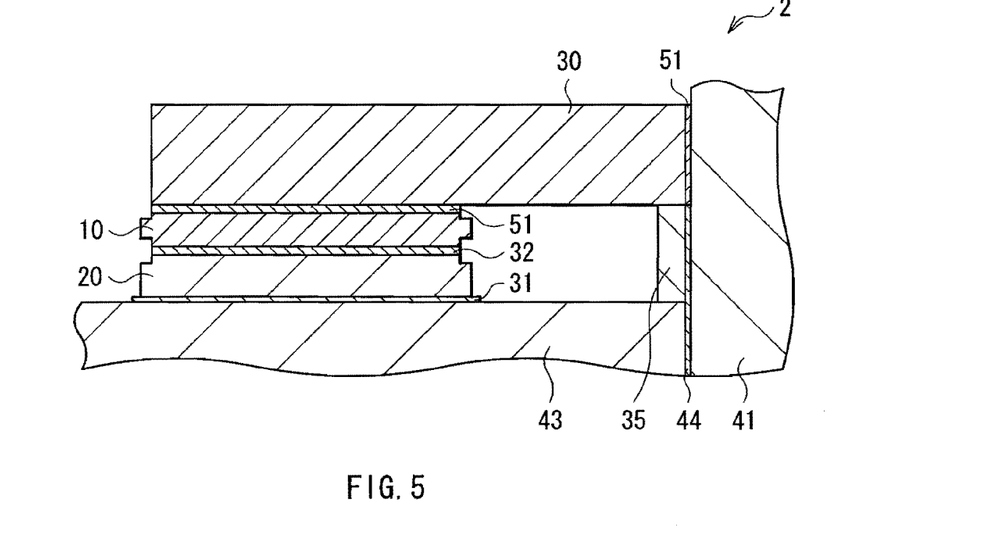
FIG. 5 is a sectional view of a first modification of the light-emitting device illustrated in FIG. 3.
Figure 6:
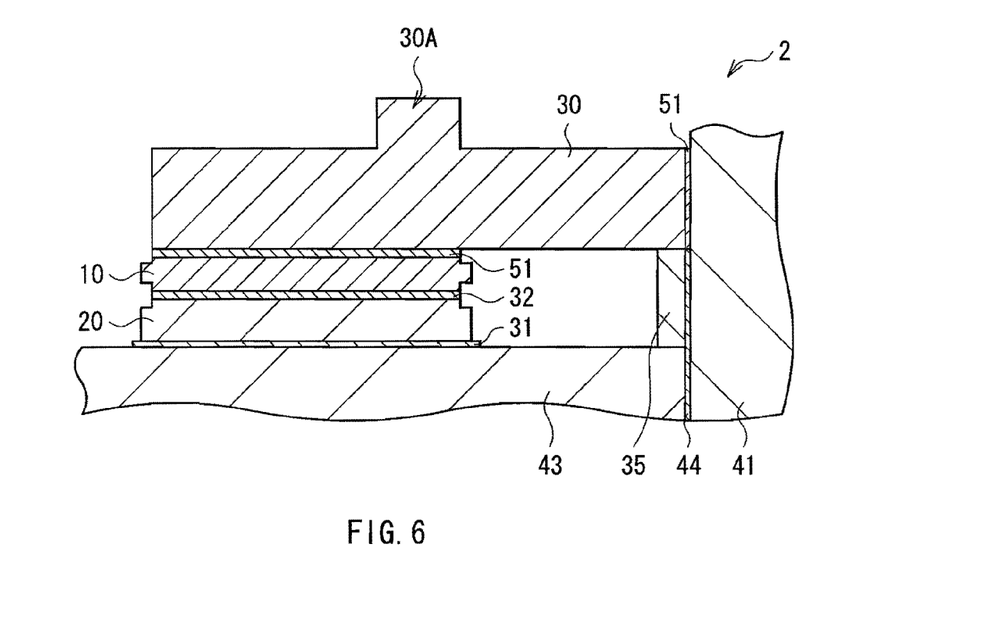
FIG. 6 is a sectional view of a second modification of the light-emitting device illustrated in FIG. 3.

In addition, the thermal conductive member 30 may have any shape other than the shape illustrated in FIG. 3B. For example, the thermal conductive member 30 may have a rectangular parallelepiped shape illustrated in FIG. 5, or a convex shape illustrated in FIG. 6 which is formed by arranging a projection section 30A on a top surface of a rectangular parallelepiped shape. Thus, in the case where the thermal conductive member 30 has a rectangular parallelepiped shape of which an end is not folded, the thickness of the thermal conductive member 30 is allowed to be increased, and in such a case, thermal conductivity and heat dissipation are further improved.

Figure 7:
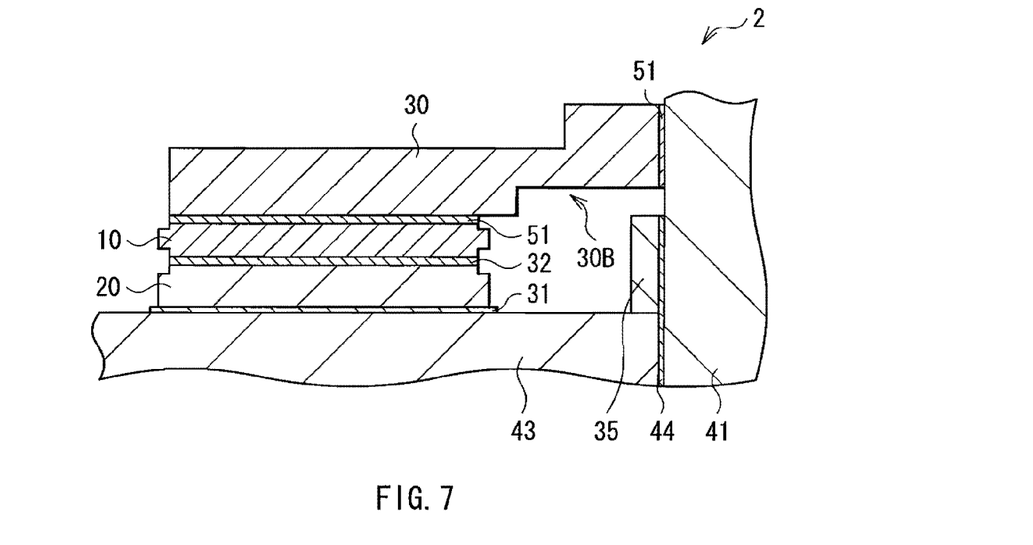
FIG. 7 is a sectional view of a third modification of the light-emitting device illustrated in FIG. 3.
Figure 8:
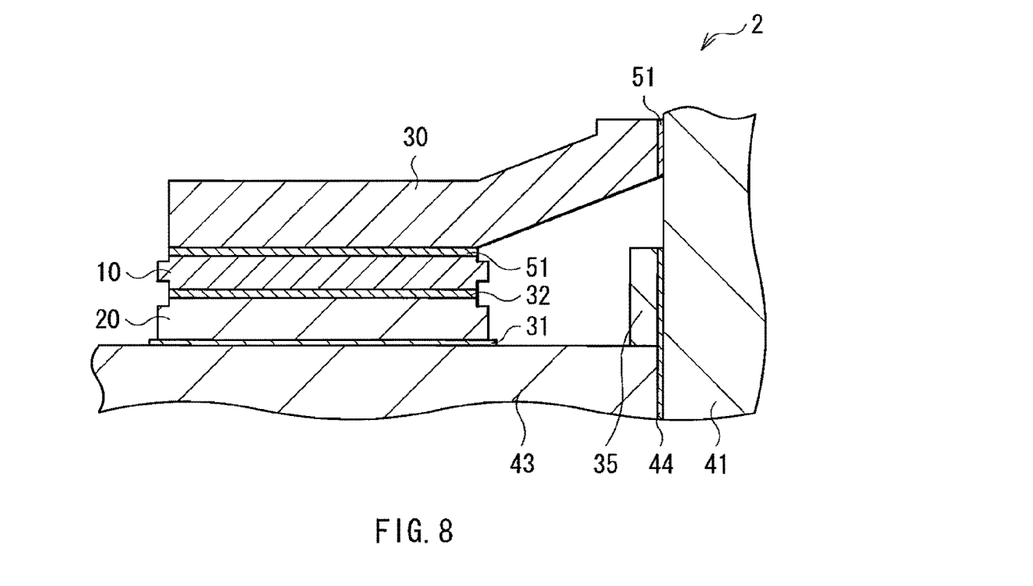
FIG. 8 is a sectional view of a fourth modification of the light-emitting device illustrated in FIG. 3.

Moreover, the thermal conductive member 30 preferably has a shape which does not block monitoring light emitted from rear ends of the light-emitting elements 10 and 20. For example, as illustrated in FIG. 7, a cutaway section 30B may be arranged in proximity to the light-receiving element 35 in a bottom surface of the thermal conductive member 30. Moreover, for example, as illustrated in FIG. 8, the thermal conductive member 30 may be obliquely folded so that the bottom surface in proximity to the light-receiving element 35 of the thermal conductive member 30 gradually deviates from the light-receiving element 35. In addition, in the case where the thermal conductive member 30 is obliquely folded as illustrated in FIG. 8, the thermal conductive member 30 has such a shape that it is difficult for the thermal conductive member 30 to reflect the monitoring light emitted from each of the light-emitting elements 10 and 20 toward the light-receiving element 35, thereby reflected light is made less likely to enter into the light-receiving element 35.

Figure 9:
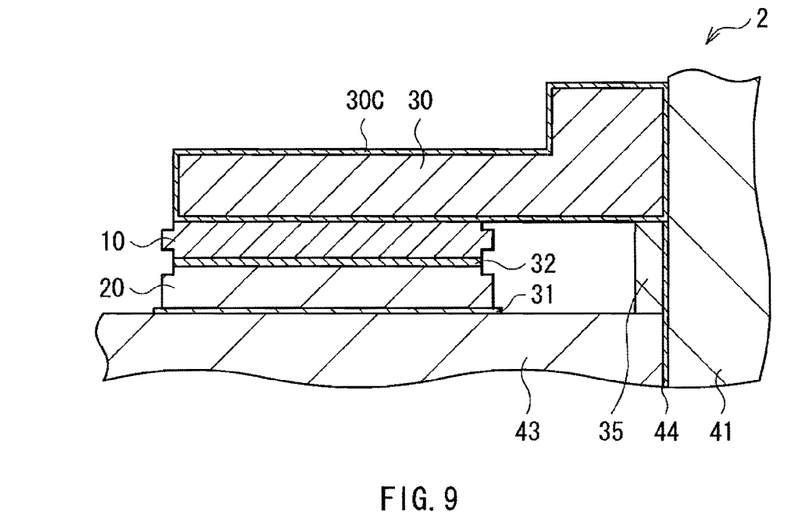
FIG. 9 is a sectional view of a fifth modification of the light-emitting device illustrated in FIG. 3.

Moreover, as illustrated in FIG. 9, a plating layer 30C made of a metal alloy or the like may be formed on the whole surface of the thermal conductive member 30. In such a case, in an assembling step, the thermal conductive member 30 is allowed to be bonded to the first light-emitting element 10 and the heat sink 41 by melting the plating layer 30C without arranging the above-described conductive bonding material 51.

Third Embodiment

Figure 10:
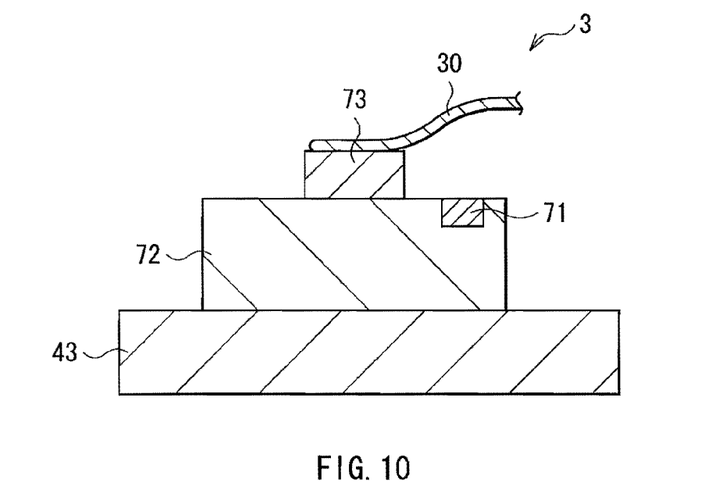
FIG. 10 is a sectional view of a light-emitting device according to a third embodiment of the invention.

FIG. 10 illustrates a sectional view of a light-emitting device 3 according to a third embodiment of the invention. The light-emitting device 3 differs from the light-emitting devices 1 and 2 according to the above-described embodiments in that only one light-emitting element is included. The light-emitting device 3 includes a submount 72 including a photodiode 71 in a top surface thereof on the die pad 43, and further includes a light-emitting element 73 on the submount 72. The light-emitting device 3 is a laser called a LOP (Laser on Photodiode). The photodiode 71 is placed in a position allowing light emitted from the light-emitting element 73 to be received on the top surface of the submount 72. The light-emitting element 73 has a laser configuration allowed to emit laser light, and is formed of, for example, a GaAs-based compound semiconductor.

The light-emitting device 3 includes the thermal conductive member 30 bonded to a top surface of the light-emitting element 73 and the heat sink 41 (not illustrated). The thermal conductive member 30 is the same as that described in the above-described embodiments, and has three functions, that is, a heat conducting function, a heat dissipating function and a wiring function.

In the light-emitting device 3, heat generated in the light-emitting element 73 is conducted to the heat sink 41 through the submount 72 and the die pad 43, and through the thermal conductive member 30. Therefore, even if the amount of heat generated in the light-emitting element 73 is large, heat generated in the light-emitting element 73 is efficiently conducted to the submount 72, and is allowed to be dissipated from the submount 72 and the thermal conductive member 30.

Modifications

Although the present invention is described referring to the embodiments, the invention is not limited thereto, and may be variously modified. In the above-described embodiments, the case where the light-emitting device is mounted in an optical disk device is described. However, the light-emitting device may be mounted in a laser printer needing high power. The light-emitting device mounted in the laser printer may have a configuration in which a light-emitting element emitting high-power single-wavelength laser light is mounted in the package 40, and the thermal conductive member 30 is arranged astride the light-emitting element and the package 40.

Moreover, in the above-described embodiments, the case where the chip size of the first light-emitting element 10 is smaller than that of the second light-emitting element 20 is described. However, the chip size of the first light-emitting element 10 may be equal to or larger than that of the second light-emitting element 20.

The present application contains subject matter related to that disclosed in Japanese Priority Patent Application JP2009-040768 filed in the Japan Patent Office on Feb. 24, 2009, the entire content of which is hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
   a light-emitting element arranged on a first supporting base;
   a package (i) covering the first supporting base and the light-emitting element, and (ii) supporting the first supporting base;
   and a thermal conductive member having a side obliquely bonded to surfaces of (i) the light-emitting element and (ii) the package, respectively,
   wherein,
   the surfaces of the light-emitting element and the package that are obliquely bonded to the thermal conductive member extend perpendicularly to each other, and
   the thermal conductive member is operable to supply power to the light-emitting element.

2. The light-emitting device according to claim 1, wherein the package includes a second supporting base and a lid, the second supporting base supporting the first supporting base, the lid covering the first supporting base and the light-emitting element,
   the light-emitting element includes an electrode on a side farther from the first supporting base in relation to the first supporting base, and
   the thermal conductive member is bonded to the electrode and the second supporting base, respectively.

3. The light-emitting device according to claim 2, wherein the light-emitting element is arranged on a side surface of the first supporting base in relation to the second supporting base, and
   a normal of the electrode and a normal of a surface bonded to the thermal conductive member of the package are orthogonal to each other.

4. The light-emitting device according to claim 2, wherein the second supporting base is made of metal,
   the package includes a connection terminal connected to the second supporting base, and
   the thermal conductive member is bonded to the electrode and the second supporting base.

5. The light-emitting device according to claim 1, wherein the thermal conductive member is a sheet-shaped member or a plate-shaped member made of metal.

6. The light-emitting device according to claim 1, wherein the thermal conductive member is made of a material mainly containing aluminum or gold.

7. The light-emitting device according to claim 1, wherein the light-emitting element includes a first light-emitting element and a second light-emitting element which are laminated in order from a side farther from the first supporting base, the second light-emitting element having a larger chip size than that of the first light-emitting element, and
   the thermal conductive member is bonded to the first light-emitting element.

8. The light-emitting device according to claim 1, wherein a first conductive bonding material is included between the light-emitting element and the thermal conductive member and between the package and the thermal conductive member.

9. The light-emitting device according to claim 8, wherein a second conductive bonding material is included between the light-emitting element and the first supporting base, and
   the melting point of the first conductive bonding material is lower than that of the second conductive bonding material.

10. The light-emitting device according to claim 8, wherein a third conductive bonding material is included between the light-emitting element and another light-emitting element, and
    the melting point of the first conductive bonding material is lower than that of the third conductive bonding material.

11. The light-emitting device according to claim 1, further comprising:
    a light-receiving element operable to receive monitoring light emitted from the light-emitting element, wherein the thermal conductive member is arranged in a position other than on an optical path of the monitoring light.

* * * * *